United States Patent [19]

Carnes

[11] 4,001,861
[45] Jan. 4, 1977

[54] DOUBLE-LAYER, POLYSILICON, TWO-PHASE, CHARGE COUPLED DEVICE

[75] Inventor: James E. Carnes, Cranbury, N.J.

[73] Assignee: The United States of America as represented by the Secretary of the Navy, Washington, D.C.

[22] Filed: Oct. 12, 1973

[21] Appl. No.: 406,052

[52] U.S. Cl. .................................. 357/24; 357/59
[51] Int. Cl.² ................. H01L 29/78; H01L 29/04
[58] Field of Search .............................. 357/24, 59

[56] References Cited
UNITED STATES PATENTS 3,690,968  9/1972  Fa et al. ............................ 317/235

OTHER PUBLICATIONS

Appl. Phys. Lett. vol. 22, No. 6, Mar. 15, 1973, Shimizu et al.

Primary Examiner—Edward J. Wojciechowicz
Attorney, Agent, or Firm—R. Sciascia; R. Beers; S. Sheinbein

[57] ABSTRACT

In a two-phase, charge-coupled device having alternate rows of internal and overlapping external electrodes, the external electrodes are fabricated from polysilicon instead of aluminum as heretofore, the internal electrodes also being of polysilicon. Sets of corresponding electrodes are then connected to a bus bar at each end, each bus bar for the same set of corresponding electrodes carrying the same phase, or clocking, signal.

3 Claims, 2 Drawing Figures

DOUBLE-LAYER, POLYSILICON, TWO-PHASE, CHARGE COUPLED DEVICE

BACKGROUND OF THE INVENTION

This invention relates to charge-coupled devices (CCD) and especially to two-phase, charge-coupled, metal-oxide semiconductor (MOS) devices with overlapping polysilicon gates.

Two-phase CCD's in the form of polysilicon overlapped by aluminum (see "Two-Phase Charge-Coupled Devices with Overlapping Polysilicon and Aluminum Gates," Kosonocky and Carnes, RCA Review, Volume 34, March 1973, Page 164) have proved to be viable structures capable of high yield and excellent operation in devices such as analog computers where they can be used as shift registers, for example. High packing density is possible without using stringent manufacturing tolerances. However, these devices have a basic limitation when used in area arrays due to the resistance of the polysilicon gates. Clock pulses are delayed by the RC time of the poly gate relative to the delay down the aluminum clock lines. In order to minimize this effect, the polysilicon is grown as thick as possible which cuts down the light which reaches the silicon substrate thereby reducing sensitivity (the charge in these devices can be transferred by an electrical signal or a light signal). Area imagers made in this fashion will be limited to about 200 vertical TV lines (assuming polysilicon resistance of 50 $\Omega$/ □ ).

Also, if aluminum gates are used and it is desired to transfer charge by means of light signals, the array must be illuminated from the bottom (assuming that the top is where the aluminum is located).

SUMMARY OF THE INVENTION

The present invention is a two-phase, charge-coupled device which employs polysilicon gates overlapped by polysilicon gates. The long gate electrodes of one phase are connected at both ends to a pair of bus lines carrying its clock signal and the long gate electrodes of the second phase are connected at both ends to another pair of bus lines carrying the other clock signal.

An object of this invention is to minimize the relative delay of clock pulses between two long adjacent gate electrodes in a two-phase, charge-coupled device.

Another object is to admit more light through a two-phase, charge-coupled device.

DETAILED DESCRIPTION OF THE PREFERRED EMBODIMENTS

Figures 1, 2:
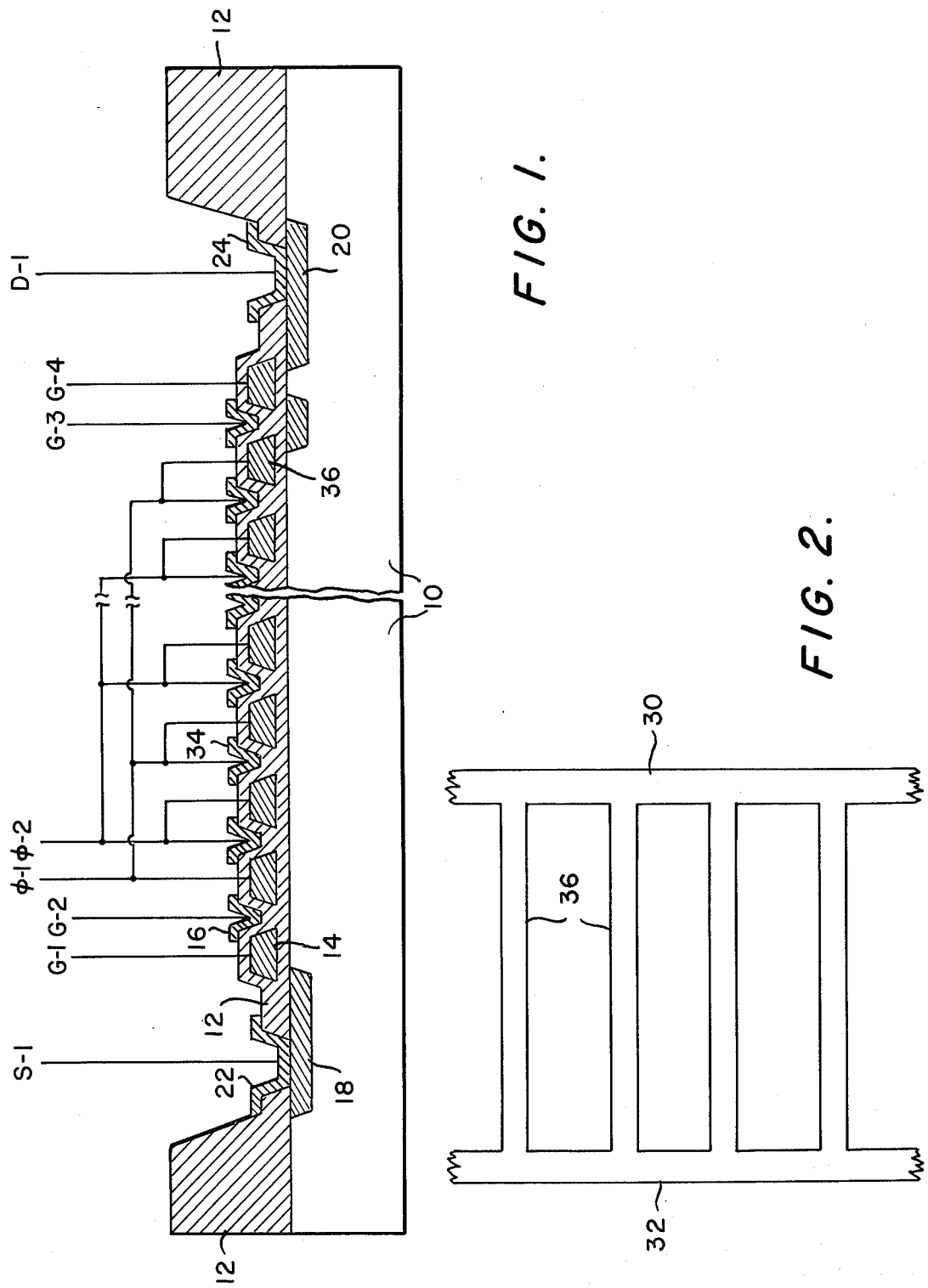
FIG. 1 is a cross-sectional view of an embodiment of a two-phase, charge-coupled device in accordance with the invention.
FIG. 2 is a schematic illustration of the clocking buses used with the invention.

FIG. 1 illustrates, in cross-sectional view, one embodiment of a two-phase, charge-coupled device made in accordance with the invention. A discussion of two-phase, CCD's is given in the previously mentioned article. Briefly, the device has an N-type silicon substrate 10 with a layer 12 of silicon dioxide lying above it. There is an input source electrode 18 made of P-type silicon with an input gate 22 of polysilicon above it. There is an output drain 20 of P-type silicon with an output polysilicon gate 24 above it.

Between the input and output gates, there are a plurality of spaced polysilicon gates 14 located internally of the $SiO_2$ layer (the channel layer) and a set of polysilicon gates 16 located on the outer surface of the channel layer 12 and alternating with the set of internal gates 14. The external gates 16 will be called the overlapping gates because, as can be seen, their sides overlap the sides of the internal gates 14.

The symbol S-1 is the input signal, electrical in nature in this case. G-1, G-2, G-3 and G-4 refer to fixed biases for the gates to which they are connected. D-1 is the output signal taken from output gate 24. $\phi$-1 is a first clocking signal and $\phi$-2 is a second clocking signal, which differs in phase from $\phi$-1. These signals may be substantially square-waved in shape.

The electrodes, and the entire device in fact, extend back into the paper as seen in FIG. 1. The device is roughly rectangular as viewed from above, and for a 128-stage shift register, for which the device might be used, would have length to width dimensions roughly in the ratio of 12 to 1.

The prior-art use of aluminum for the overlapping electrodes 16 leads to a relative delay between the two sets of electrodes, since the signals take more time in traveling down the polysilicon electrodes which act as transmission lines. The relative delay is minimized by the use of polysilicon for the overlapping electrodes 16 as well as for the internal electrodes 14. To minimize delay along the length of the gate electrodes (the length of the gate electrodes is substantially equivalent to the width of the device), a bus line carrying the phase clock pulses is used at each end of the electrodes to connect the ends. Thus, FIG. 2 shows a bus line 30 connecting the ends of the phase-1 overlapping electrodes 34 at the right side and another bus line 32 connecting them at the left side. The phase-1 overlapping set of electrodes can thus be said to be a "corresponding" set of electrodes since they correspond to each other in type of electrode and in the clocking signal fed to each one. The phase-1 internal electrodes 36 would also have a pair of bus lines making them double-end connected. Since there are also internal and overlapping electrodes fed by the phase-2 clock signal, two more pairs of bus lines would be needed.

Since the aluminum covers 67% of the upper surface of prior-art devices, the present device admits three times as much light. Further, even more light can be transmitted through the device since the polysilicon layers can be two or three times thinner. This increases the light by a factor of about 10.

Obviously, many modifications and variations of the present invention are possible in light of the above teachings. It is therefore to be understood that, within the scope of the appended claims, the invention may be practiced otherwise than as specifically described.

I claim:

1. In a two-phase, charge-coupled device comprising a semiconductor substrate, an insulating layer on one side of said substrate, and first rows of spaced, polysilicon, long gates alternating with second rows of long gates which overlap the adjacent first rows, said first rows being external to and said second rows being internal to said insulating layer, the improvement wherein said overlapping gates are fabricated from polysilicon material.

2. In a charge-coupled device comprising a semiconductor substrate, a layer of silicon dioxide ($Si\,O_2$) on one surface thereof, a row of electrodes located internally of said Si $O_2$ layer, and a row of electrodes located on the free surface of said Si $O_2$ layer, the longitudinal axes through said external electrodes being transversely displaced with respect to the longitudinal axes through said internal electrodes but parallel thereto, the improvement wherein said external electrodes are fabricated from polysilicon material.

3. The device of claim 2, wherein said internal electrodes are fabricated from polysilicon material.

* * * * *